(12) United States Patent  
Ahmad et al.

(10) Patent No.: US 7,355,426 B2
(45) Date of Patent: Apr. 8, 2008

(54) UNIVERSAL MEASURING ADAPTER SYSTEM

(75) Inventors: Isa Ahmad, Staudheim (DE); Christian Burmer, Rohrdorf (DE); Anton Stuffer, Rohrdorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/179,344

(22) Filed: Jul. 12, 2005

(65) Prior Publication Data

US 2006/0024990 A1 Feb. 2, 2006

Related U.S. Application Data

(63) Continuation of application No. PCT/DE03/04176, filed on Dec. 18, 2003.

(30) Foreign Application Priority Data

Jan. 14, 2003 (DE) ................ 103 01 124

(51) Int. Cl.
*G01R 31/02* (2006.01)
(52) U.S. Cl. .................................... 324/755
(58) Field of Classification Search ............. None
See application file for complete search history.

(56) References Cited

U.S. PATENT DOCUMENTS

| | | |
|---|---|---|
| 5,123,850 A | 6/1992 | Elder et al. |
| 5,387,861 A | 2/1995 | Neiderhofer |
| 5,859,538 A | 1/1999 | Self |
| 5,896,037 A * | 4/1999 | Kudla et al. ............... 324/755 |
| 5,982,635 A * | 11/1999 | Menzies et al. ............ 361/790 |
| 6,176,709 B1 | 1/2001 | Sonobe et al. |
| 2002/0117330 A1 | 8/2002 | Eldridge et al. |

FOREIGN PATENT DOCUMENTS

| | | |
|---|---|---|
| DE | 197 01 336 C2 | 8/1997 |
| GB | 2 104 669 A | 3/1983 |

* cited by examiner

*Primary Examiner*—Jermele Hollington
(74) *Attorney, Agent, or Firm*—Slater & Matsil, L.L.P.

(57) ABSTRACT

The invention relates to a universal measuring adapter system for adapting or contacting semiconductor components in the most varied packages for electrically operating and measuring the same. The pins or contact pads of the package are electrically contacted on the input side in a specially adapted socket, and the socket, on the side of the device (output side), has contact pins whose pin assignment corresponds to the pin assignment of the package contacted inside the socket. The aim of the invention is to create a universal measuring system for adapting or contacting semiconductor components in the most varied packages for electrically operating, measuring and analyzing the same, with which, on the side of the device, the pin numbers can always be tapped at the same location regardless of the package and which is suited for expansion stages with any number of pins and pin configurations. To this end, a socket adapter, which is comprised of at least one adapter board, is arranged between the socket and a PGA socket with a standardized contact assignment. Said socket adapter depicts the rewiring of each individual connection of the package in a special pattern that always has the same orientation.

20 Claims, 2 Drawing Sheets

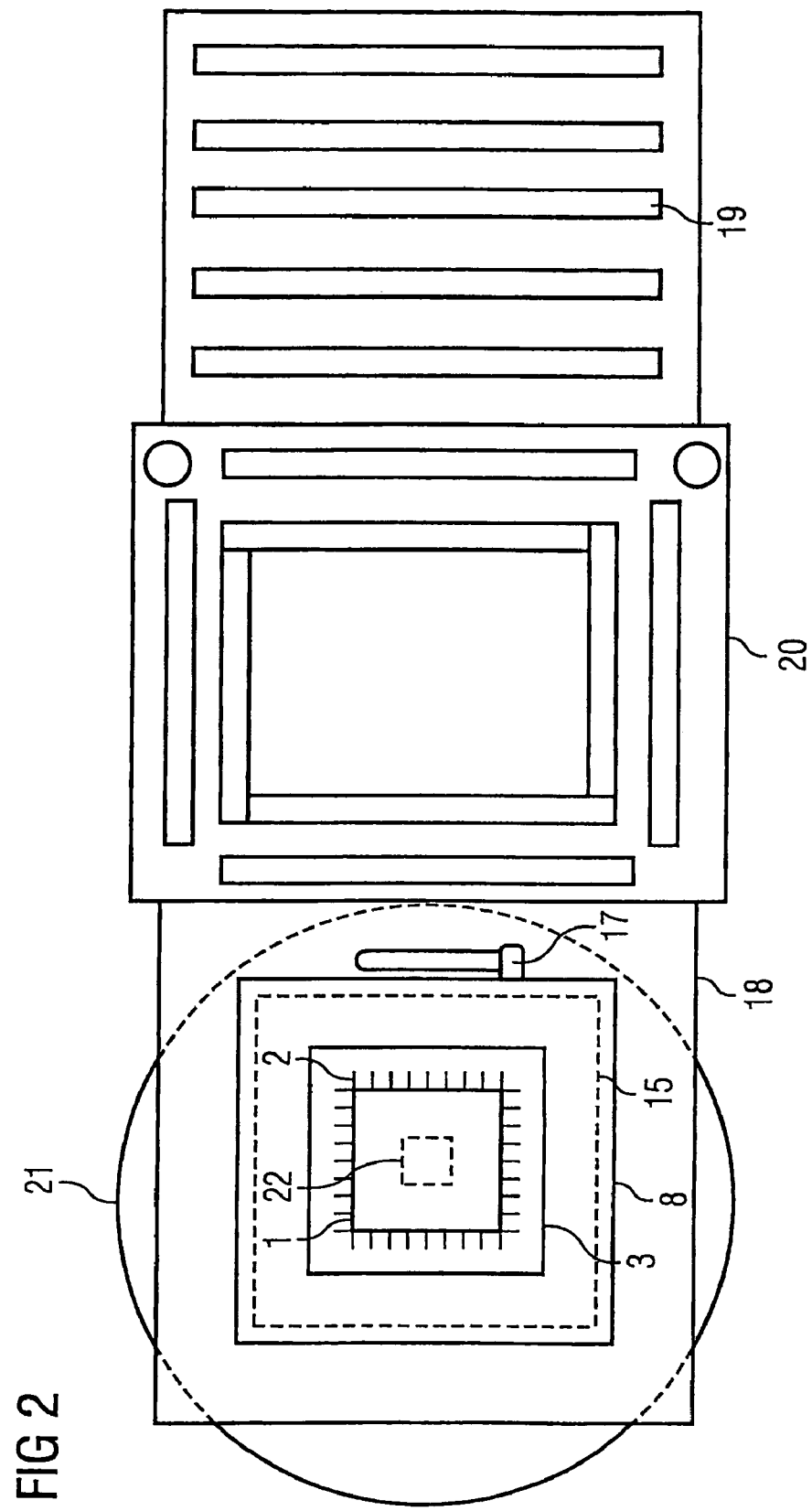

UNIVERSAL MEASURING ADAPTER SYSTEM

This application is a continuation of co-pending International Application No. PCT/DE2003/004176, filed Dec. 18, 2003, which designated the United States and was not published in English, and which is based on German Patent Application No. 103 01 124.2 filed Jan. 14, 2003, both of which applications are incorporated herein by reference.

TECHNICAL FIELD

The invention relates to a universal measuring system for adapting or contacting semiconductor components in the most varied packages for electrically operating, measuring and analyzing the same, in which system the packages are electrically contacted in a specially adapted socket.

BACKGROUND

In practice, the most varied packages for semiconductor components are developed and used according to the application requirements, it being possible for the number of pins, that is the number of terminal contacts for the connection of the semiconductor components to a PCB (printed circuit board) or other carrier elements, to amount for example to 1020. These pins generally protrude laterally from the package and are angled away one or more times in the downward direction, so that a solder contact with a PCB can then take place. However, the assignment of the pins is not necessarily consistent, but depends on the type of components located in the package and also on the user-specific requirements.

The fact that the completed packages have to be subjected to a functional test, and possibly a burn-in (artificial pre-aging) prior to their delivery creates the problem that on the one hand a special socket (for example a burn-in socket) is required for each type of package and on the other hand a special tester board is necessary, allowing the electrically wired pins to be reliably contacted and connected to a testing device.

The sockets that are available for purchase are specifically designed precisely for the respective package and undertake the primary electrical contacting. This means that, in addition to the DOUT in packages with pin contacts, SMD components, such as FBGA and other components, can also be contacted in special sockets. The sockets are for their part provided with solder contacts, which, however, replicate 1:1 the terminal assignment of the components held.

It is, therefore, necessary to produce for each product and for each package a special tester board in which allowance is made for the differing pin assignment of the components or sockets.

Such a procedure is very complex, however, and consequently cost-intensive, and is, therefore, scarcely economically viable for relatively small series of identical packages.

SUMMARY OF THE INVENTION

The invention is therefore based on the object of providing a universal measuring system for adapting or contacting semiconductor components in the most varied packages for electrically operating, measuring and analyzing the same, with which system the pin numbers can always be picked up at the same point on the device side irrespective of the package and which system is suitable for expansion stages with any number of pins and pin configurations.

The object is achieved according to the invention in the case of a measuring adapter system of the type stated at the beginning by a socket adapter, comprising adapter boards, being arranged between the socket and a PGA socket (PGA: Pin Grid Array) with standardized contact assignment, which adapter replicates the redistribution routing of each individual terminal of the package in a special grid that always has the same orientation.

As a result of the redistribution routines of the adapter boards of the socket adapter, each defined terminal of a package provided with primary electrical contacting by means of a socket matched to the package is always connected at the same point of the PGA socket. With the package-specific configuration of the redistribution routing of the adapter boards, this applies to virtually any package, so that, irrespective of the package of the semiconductor component to be tested, a consistent output-side pin assignment of the PGA socket is available, to make this system further suitable for universal use on various analysis tools.

A package of which the semiconductor component is to be electrically measured is initially placed into the socket adapter and, adapted to such an extent, can be connected to the most varied devices, in particular probe stations, testers or curve tracers, and be operated, measured and/or analyzed there in the most varied of ways, without further complex and cost-intensive adaptations having to be performed.

With two adapter boards, according to a particularly favorable configuration according to the invention, the first adapter board serving for receiving the socket and the second adapter board having the standardized pinning for the contacting with the PGA socket, it is possible in particular to replicate the pins of the most varied sockets in a 256-pin, 600-pin or 1020-pin PGA grid in such a way that these three groups are downward-compatible.

In further advantageous refinements of the invention in this respect, either pin 1 of the PGA-side adapter board is always replicated as assigned to terminal 1 of the package, pin 2 of the PGA-side adapter board is always replicated as assigned to terminal 2 of the package, etc., or pin 1 of any package is always connected at the same point of the PGA socket.

The configuration of the adapter boards with plated-through holes and their connection to one another by means of plug-in contacts, each of the adapter boards being provided with redistribution routing in such a way that the distribution of the plug-in contacts of the socket is transformed into the standardized grid of the PGA socket, represents a favorable embodiment, since, along with the lower space requirement in comparison with contacting by means of contact areas, it is possible, according to the application in question, to produce both a detachable contact, by the plug-in connection, and a soldered plug-in connection, to increase the contact reliability.

Furthermore, it is possible according to the invention to stabilize the plug-in connection of the socket adapter to the PGA socket by additional soldering or by mechanical clamping means, such as those which zero force sockets have.

If the semiconductor component for measuring or analysis is to be wired, or direct contacting of the socket adapter with respect to the measuring or analyzing arrangement is not possible for other reasons, the invention proposes the use of a measuring board, which comprises the PGA socket and has conductive patterns which convert the contacts of the socket into contact pins. The measuring or analyzing arrangement can be connected to these contact pins. Such contact pins may take the form of contact beams or a further socket. Consequently, plugging-on or connecting the socket adapter immediately makes all the terminals of the package available at the contact pins in a standardized assignment.

Furthermore, in the solution according to the invention with the known conductive patterns, plug-in locations on the measuring board at which all terminals of the package are likewise available in a standardized assignment, and which can receive further boards (for example saddle boards), can be contacted. On such saddle boards, the semiconductor component can be operated or wired either by means of setting jumpers, reconnecting pins or by means of a circuit constructed on it.

For measuring the semiconductor component under a defined temperature regime, it is provided according to one refinement of the invention to connect the measuring board to a copper plate (chuck), which is brought to the desired temperature directly or indirectly and is in thermal connection with the package by means of further connecting parts made of copper.

BRIEF DESCRIPTION OF THE DRAWINGS

The invention is to be explained in more detail below on the basis of an exemplary embodiment. In the associated drawing:

FIG. 2 shows the plan view of a schematic construction of the measuring system according to claim 12.

Figure 1:
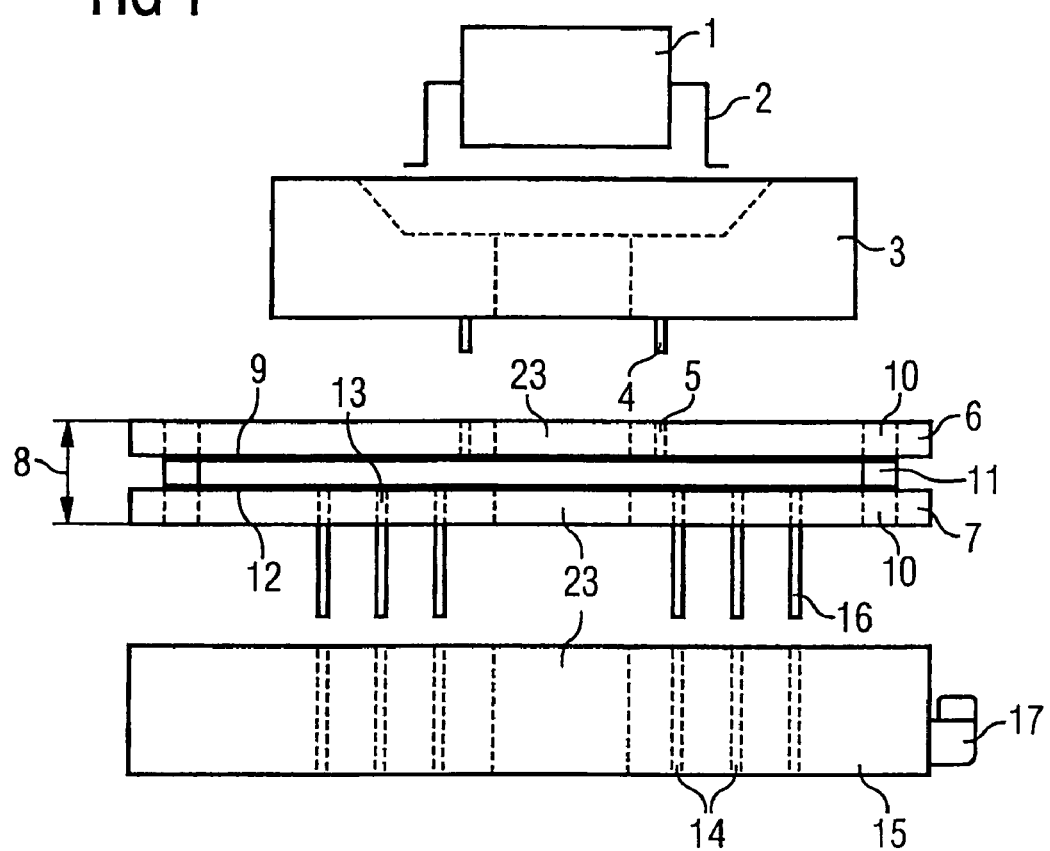
FIG. 1 shows the side view of the schematic construction of the measuring system, represented as an exploded drawing.

The following list of reference symbols can be used in conjunction with the figures:

1 package
2 pin
3 socket
4 first plug-in contacts
5 first plated-through holes
6 upper adapter board
7 lower adapter board
8 socket adapter 20 saddle board
9 first pattern of conductive traces
10 second plug-in contacts
11 second plated-through holes
12 second pattern of conductive traces
13 third plated-through holes
14 grid
15 PGA socket
16 third plug-in contacts
17 arresting lever
18 measuring board
19 contact pin
21 copper plate
22 copper block
23 clearances

DETAILED DESCRIPTION OF ILLUSTRATIVE EMBODIMENTS

As represented in FIG. 1, the package 1 has laterally protruding pins 2, which are angled away twice in the downward direction to produce the contact with the socket 3. This socket 3 replicates 1:1 the terminal assignment of the pins 2 of the package 1 on first plug-in contacts 4 protruding on its underside.

These first plug-in contacts 4 are plugged into first plated-through holes 5 of the upper adapter board 6 of a system of two connected adapter boards, referred to hereafter as socket adapter 8, soldered and consequently electrically connected.

The upper adapter board 6 has on its underside a first pattern of conductive traces 9, which redistributes the routing from the first plated-through holes 5 to second plated-through holes 11 in the outer region of the upper adapter board 6. By plugging together and subsequently soldering the second plug-in contacts 10 with the second plated-through holes 11, the latter being located in corresponding positions in the outer regions of the upper adapter board 6 and the lower adapter board 7 and being electrically connected to the first pattern of conductive traces 9, a reliable mechanical and electrical connection of the upper adapter board 6 to the lower adapter board 7 is produced in such a way that a distance remains between the two.

By means of a second pattern of conductive traces 12, located on the lower adapter board 7, the contacts of the second plated-through holes 11, located in the edge region, are redistributed in their routing to a grid of third plated-through holes 13 present in the central region of the lower adapter board 7 corresponding to the standardized grid 14 of contacts of the PGA socket 15. The electrical connection of the socket adapter 8 to the PGA socket 15 takes place by third plug-in contacts 16. Since the PGA socket 15 is configured as a zero force socket, the mechanical arrestment of the socket adapter 8 in the PGA socket 15 takes place in the described exemplary embodiment by shifting the arresting lever 17, which has the effect that arresting parts (not represented any more specifically) releasably engage in one another.

In FIG. 2, the arrangement of a system constructed in a way corresponding to FIG. 1 on a measuring board 18 is represented. The measuring board 18 is a board on which the PGA socket 15 is attached and the standardized grid 14 of electrical contacts of which is redistributed in its routing by a pattern of conductive traces (not represented any more specifically) to a row of contact pins 19, which serve for the connection of the measuring system to external measuring and analyzing arrangements, and at the same time to plug-in locations (not represented any more specifically) which make it possible to receive a saddle board 20.

The measuring board 18 also has a round copper plate 21 (chuck) located on its underside, in the region of the PGA socket 15. A cuboidal copper block 22 is in thermal contact with the copper plate 21 and with the package 1 through corresponding clearances 23 (see FIG. 1) in the PGA socket 15, in the socket adapter 8 and, in the present exemplary embodiment, also in the socket 3, so that measurements, analyses or a burn-in of the package 1 can be carried out at different temperatures by means of a defined temperature regime of the copper plate 21.

What is claimed is:

1. A system for adapting and/or contacting pins or contact pads on a packaged semiconductor component for electrically operating and measuring the same, the system comprising:
    a socket, wherein the socket comprises a top side and a bottom side, the top side including contact areas to make electrical contact with the package pins, contact pads or terminals of the packaged semiconductor component, and the bottom side including pins arranged in a pin assignment that corresponds to a pin assignment of the package contacted in the socket;
    a PGA socket with a standardized contact assignment; and
    a socket adapter arranged between the socket and the PGA socket, the socket adapter comprising at least one adapter board, the socket adapter horizontally routing the contact pins of the socket into a grid of contacts arranged according to the standard contact assignment.

2. The system as claimed in claim 1, wherein the socket adapter includes an upper adapter board and a lower adapter board, the upper adapter board for receiving the socket and the lower adapter board having the grid of contacts arranged according to the standard contact assignment.

3. The system as claimed in claim 1, wherein the routing takes place in two planes of the socket adapter in such a way tat a pin 1 always goes to a terminal 1 of the package, a pin 2 always goes to a terminal 2 of the package, and so on.

4. The system as claimed in claim 3, wherein the terminal 1 of any package is always connected at the same point of the PGA socket.

5. The system as claimed in claim 1, wherein the socket adapter includes two adapter boards that are provided with second plated-through holes, which are connected to one another by means of second plug-in contacts, each of the adapter boards being provided with redistribution routing in such a way that the distribution of the first plug-in contacts of the socket is transformed into the standardized grid of the PGA socket.

6. The system as claimed in claim 1, wherein the socket adapter and the socket are securely connected to one another by soldering.

7. The system as claimed in claim 1, wherein the PGA socket comprises a zero force socket.

8. The system as claimed in claim 1, wherein the PGA socket is arranged and electrically contacted on a measuring board, which has a pattern of conductive traces that redistributes the routing of the contacts of the PGA socket to contact pins.

9. The system as claimed in claim 8, wherein the pattern of conductive traces of the measuring board redistributes the routing of the contacts of the PGA socket to plug-in locations for receiving further boards.

10. The system as claimed in claim 8, wherein the measuring board has a copper plate, which is thermally connected to the package by means of suitable copper parts.

11. A universal measuring system for adapting or contacting semiconductor components in varied packages for electrically operating and measuring the same, in which system the pins or contact pads of the package are electrically contacted on an input side of a specially adapted socket, the specially adapted socket having on an output side contact pins of which the pin assignment corresponds to the pin assignment of the package contacted in the socket, wherein a socket adapter, comprising at least one adapter board, is ranged between the socket and a PGA socket with standardized contact assignment, and wherein the socket adapter replicates the redistribution routing of each individual terminal of the package in a special grid that always has the seine orientation.

12. The universal measuring system as claimed in claim 11, wherein the socket adapter includes an upper adapter board and a lower adapter board, the upper adapter board for receiving the specially adapted socket and the lower adapter board having the standardized grid for the contacting with the PGA socket.

13. The universal measuring system as claimed in claim 12, wherein the redistribution routing takes place in the two planes of the adapter boards in such a way that a pin 1 always goes to a terminal 1 of the package, a pin 2 always goes to a terminal 2 of the package, and so on.

14. The universal measuring system as claimed in claim 13, wherein the terminal 1 of any package is always connected at the same point of the PGA socket.

15. The universal measuring system as claimed in claim 12, wherein the adapter boards are provided with second plated-through holes, which are connected to one another by means of second plug-in contacts, each of the adapter boards being provided with redistribution routing in such a way that the distribution of the first plug-in contacts of the socket is transformed into the standardized grid of the PGA socket.

16. The universal measuring system as claimed in claim 11, wherein the socket adapter and the specially adapted socket are securely connected to one another by soldering.

17. The universal measuring system as claimed in claim 11, wherein the PGA socket is formed as a zero force socket.

18. The universal measuring system as claimed in claim 11, wherein the PGA socket is arranged and electrically contacted on a measuring board, the measuring board having a pattern of conductive traces which redistributes the muting of the contacts of the PGA socket to contact pins.

19. The universal measuring system as claimed in claim 18, wherein the pattern of conductive traces of the measuring board redistributes the routing of the contacts of the PGA socket to plug-in locations for receiving further boards.

20. The universal measuring system as claimed in claim 18, wherein the measuring board has a copper plate tat is thermally connected to the package by means of suitable copper parts.

\* \* \* \* \*

UNITED STATES PATENT AND TRADEMARK OFFICE
CERTIFICATE OF CORRECTION

PATENT NO. : 7,355,426 B2 Page 1 of 1
APPLICATION NO. : 11/179344
DATED : April 8, 2008
INVENTOR(S) : Ahmad et al.

It is certified that error appears in the above-identified patent and that said Letters Patent is hereby corrected as shown below:

In Col. 2, line 9, delete "routines" and insert --routings--.
In Col. 5, line 8, delete "tat" and insert --that--.
In Col. 6, line 1, delete "ranged" and insert --arranged--.
In Col. 6, line 5, delete "seine" and insert --same--.
In Col. 6, line 35, delete "muting" and insert --routing--.
In Col. 6, line 42, delete "tat" and insert --that--.

Signed and Sealed this

First Day of July, 2008

JON W. DUDAS
*Director of the United States Patent and Trademark Office*